(12) United States Patent
Liu

(10) Patent No.: US 12,252,074 B2
(45) Date of Patent: Mar. 18, 2025

(54) VEHICULAR CAMERA MODULE WITH MICRO-LENS ARRAY AT IMAGER

(71) Applicant: Magna Electronics Inc., Auburn Hills, MI (US)

(72) Inventor: Xiyuan Liu, Moembris (DE)

(73) Assignee: Magna Electronics Inc., Auburn Hills, MI (US)

( * ) Notice: Subject to any disclaimer, the term of this patent is extended or adjusted under 35 U.S.C. 154(b) by 31 days.

(21) Appl. No.: 18/297,027

(22) Filed: Apr. 7, 2023

(65) Prior Publication Data

US 2023/0322158 A1 Oct. 12, 2023

Related U.S. Application Data

(60) Provisional application No. 63/362,701, filed on Apr. 8, 2022.

(51) Int. Cl.
| | | |
|---|---|---|
| *B60R 1/22* | (2022.01) | |
| *G02B 1/11* | (2015.01) | |
| *G02B 3/00* | (2006.01) | |
| *G02B 5/28* | (2006.01) | |
| *G03F 1/38* | (2012.01) | |

(52) U.S. Cl.
CPC ............... *B60R 1/22* (2022.01); *G02B 1/11* (2013.01); *G02B 3/005* (2013.01); *G02B 5/283* (2013.01); *G03F 1/38* (2013.01); *B60R 2300/10* (2013.01)

(58) Field of Classification Search
CPC ......... B60R 1/22; B60R 2300/10; G02B 1/11; G02B 3/005; G02B 5/283; G03F 1/38
See application file for complete search history.

(56) References Cited

U.S. PATENT DOCUMENTS

| | | | |
|---|---|---|---|
| 5,550,677 | A | 8/1996 | Schofield et al. |
| 5,670,935 | A | 9/1997 | Schofield et al. |
| 5,949,331 | A | 9/1999 | Schofield et al. |
| 9,041,806 | B2 | 5/2015 | Baur et al. |
| 9,126,525 | B2 | 9/2015 | Lynam et al. |
| 9,264,672 | B2 | 2/2016 | Lynam |
| 9,596,387 | B2 | 3/2017 | Achenbach et al. |
| 9,762,880 | B2 | 9/2017 | Pflug |
| 9,834,153 | B2 | 12/2017 | Gupta et al. |
| 9,900,522 | B2 | 2/2018 | Lu |
| 10,071,687 | B2 | 9/2018 | Ihlenburg et al. |
| 10,099,614 | B2 | 10/2018 | Diessner |
| 11,110,864 | B2 | 9/2021 | Huizen et al. |

(Continued)

*Primary Examiner* — Mohammed S Rahaman
(74) *Attorney, Agent, or Firm* — HONIGMAN LLP

(57) ABSTRACT

A vehicular camera includes an imaging array sensor that includes one million photosensors arranged in rows and columns and a microlens array. The microlens array includes a plurality of microlenses disposed at the imaging array sensor. Each individual microlens of the plurality of microlenses includes a respective plurality of refractive indices. The microlens array is disposed at the imaging array sensor so that light incident at the vehicular camera passes through the microlens array to be incident at the imaging array sensor. Light incident at and passing through each individual microlens of the microlens array is incident at a respective sub-array of the photosensors of the imaging array sensor. The vehicular camera is configured to be disposed at a vehicle equipped with a vehicular vision system.

20 Claims, 4 Drawing Sheets

(56) References Cited

U.S. PATENT DOCUMENTS

| | | | |
|---|---|---|---|
| 2009/0237801 A1* | 9/2009 | Liu | G02B 3/0062 |
| | | | 359/622 |
| 2010/0186798 A1* | 7/2010 | Tormen | H01L 31/0543 |
| | | | 136/246 |
| 2010/0214788 A1* | 8/2010 | Kadono | G02B 6/005 |
| | | | 428/141 |
| 2014/0168415 A1 | 6/2014 | Ihlenburg et al. | |
| 2014/0285666 A1 | 9/2014 | O'Connell et al. | |
| 2015/0022664 A1 | 1/2015 | Pflug et al. | |
| 2016/0276394 A1* | 9/2016 | Chou | H01L 27/14636 |
| 2018/0134217 A1 | 5/2018 | Peterson et al. | |
| 2020/0389576 A1* | 12/2020 | Newman | H04N 23/81 |
| 2021/0155167 A1 | 5/2021 | Lynam et al. | |
| 2021/0162926 A1 | 6/2021 | Lu | |
| 2021/0245662 A1 | 8/2021 | Blank et al. | |
| 2021/0296530 A1 | 9/2021 | Bailey | |
| 2024/0064274 A1 | 2/2024 | Blank et al. | |

\* cited by examiner

VEHICULAR CAMERA MODULE WITH MICRO-LENS ARRAY AT IMAGER

CROSS REFERENCE TO RELATED APPLICATION

The present application claims the filing benefits of U.S. provisional application Ser. No. 63/362,701, filed Apr. 8, 2022, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

A vehicular camera includes an imaging array sensor that includes at least one million photosensors arranged in rows and columns. The vehicular camera also includes a microlens array. The microlens array includes a plurality of individual microlenses disposed at the imaging array sensor. Each individual microlens of the plurality of microlenses includes a respective plurality of refractive indices. The microlens array is disposed at the imaging array sensor so that light incident at the vehicular camera passes through the microlens array to be incident at the imaging array sensor. Light incident at and passing through each individual microlens of the microlens array is incident at a respective sub-array of the photosensors of the imaging array sensor. The vehicular camera is configured to be disposed at a vehicle equipped with a vehicular vision system.

These and other objects, advantages, purposes and features of the present invention will become apparent upon review of the following specification in conjunction with the drawings.

DESCRIPTION OF THE PREFERRED EMBODIMENTS

A vehicle vision system and/or driver or driving assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a forward or rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
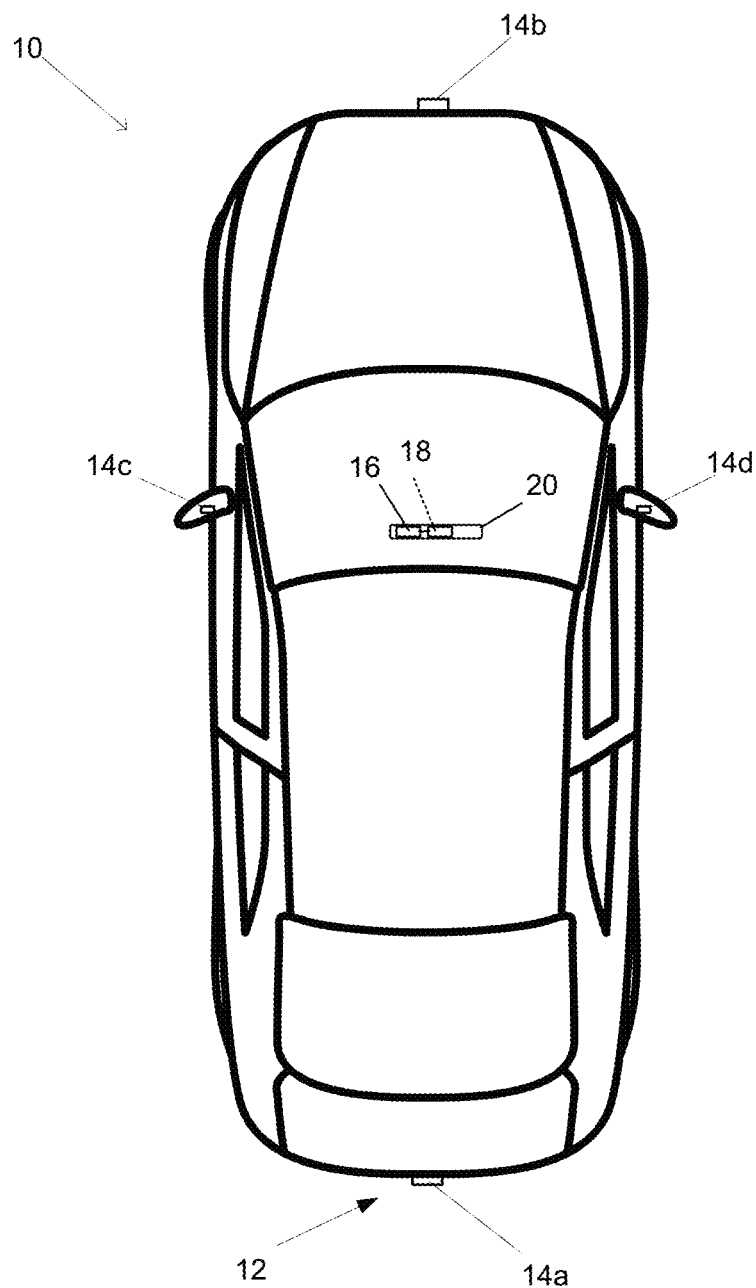
FIG. 1 is a plan view of a vehicle with a vision system that incorporates cameras.

Referring now to the drawings and the illustrative embodiments depicted therein, a vehicle 10 includes an imaging system or vision system 12 that includes at least one exterior viewing imaging sensor or camera, such as a rearward viewing imaging sensor or camera 14a (and the system may optionally include multiple exterior viewing imaging sensors or cameras, such as a forward viewing camera 14b at the front (or at the windshield) of the vehicle, and a sideward/rearward viewing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) 18 having electronic circuitry and associated software, with the electronic circuitry including a data processor or image processor that is operable to process image data captured by the camera or cameras, whereby the ECU may detect or determine presence of objects or the like and/or the system provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

Cameras have become ubiquitous in vehicles. As the number of applications for vehicular cameras increase, it has become increasingly important to reduce the size of the cameras for both cost and space savings. Microlens arrays (MLAs) are arrays of small lenses or microlenses (e.g., micrometer to millimeter in diameter). An MLA at or on the imaging sensor allows for smaller cameras by decreasing the overall pixel size of the imaging sensor. An MLA also typically increases the ray incidence angle proportional to the radial distance to the image sensor center. An MLA can compensate for mismatches of the chief ray angle after the main lens and perpendicular pixel structure in depth. Moreover, decreasing pixel pitch with conventional lens reduces quantum efficiency, while MLAs bundle light such that the quantum efficiency can be increased.

Figure 2:
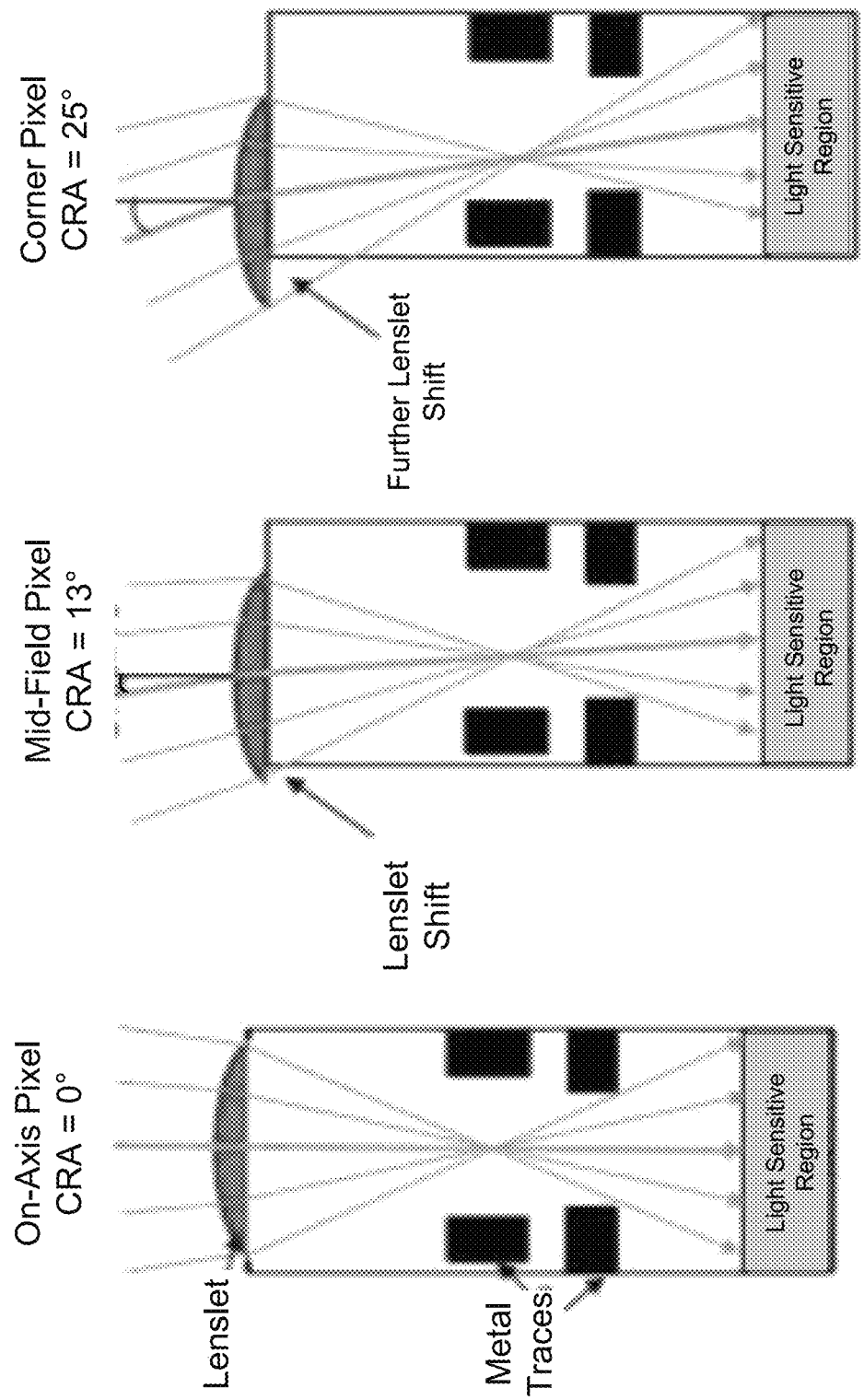
FIG. 2 is a schematic view of different three-dimensional structures of microlens arrays.
Figure 3:
FIG. 3 is an exemplary image of multi-order scattering.

Referring now to FIG. 2, conventional MLAs include a three-dimensional (3D) like structure with a spherical segment. Generally, the focal power is limited by thermal reflow technology. These conventional MLAs, when applied to vehicular applications, experience several drawbacks. For example, MLAs may cause multi-reflections between infrared (IR) filters and the microlenses. Additionally, MLAs may experience a diffractive effect caused by the 3D grating structure. An MLA may also suffer effects such as multi-order scattering and visible glare dots in images under certain scenarios (FIG. 3). Additionally, coatings (such as antireflective coatings) are difficult to apply to such 3D structures.

Figure 4:
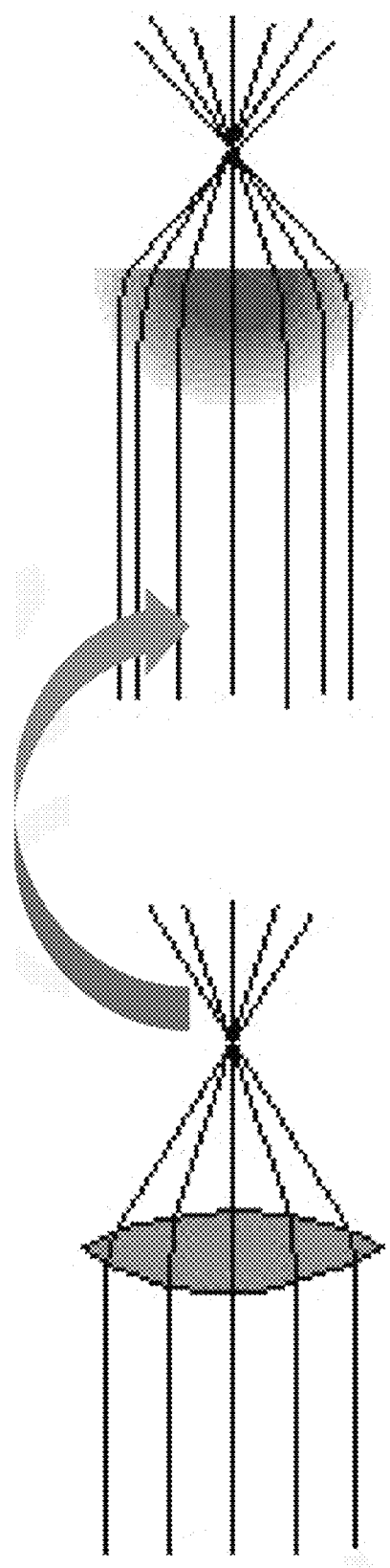
FIG. 4 is a schematic view of a first microlens using a three-dimensional structure and a second microlens using gradient refractive index.

Implementations herein include a vehicular camera with an MLA that focuses light on an image sensor using a gradient refractive index (i.e., each microlens has a plurality of refractive indices that combine or sum to provide a gradient refractive index) instead of the conventional 3D structure. The MLA is integrated onto the imaging sensor. As shown in FIG. 4, the gradient refractive index allows the surface of each microlens to be flat (i.e., planar) as opposed to a 3D structure (FIG. 2). This planar surface substrate leads to efficient or more feasible antireflection coating that is impractical or impossible to use on traditional 3D structures. Such an antireflection coating can, for example, reduce multi-order scattering (FIG. 3). The use of the planar surface also allows for radially matching of refractive power in different domains such as on-axis, mid-field, and corner domains.

Gradient refractive index refers to the gradient of the refractive index of the material of the microlenses of the MLA. For example, the refractive index of the microlens gradually changes across and/or through the microlens, allowing the microlens to focus light without a curved surface (i.e., focuses light with a planar or flat surface at each side of the microlens). In other words, each individual microlens of the plurality of microlenses of the microlens array has a first planar surface and an opposing second planar surface separated from the first planar surface by a plate thickness dimension of the individual microlenses, and light incident at the vehicular camera passes through the first planar surface and through the plate thickness dimension of the respective individual microlens to exit the second planar surface of the respective individual microlens to be incident at the respective sub-array of the photosensors of the imaging array sensor associated with that respective individual microlens. The microlenses, with such flat or planar surfaces, may not have aberrations common with conventional curved or spherical lenses. Microlens arrays using gradient refractive indexes can be manufactured using ion-exchanging (e.g., silver-sodium ion exchange) and metal masks produced by precise lithographic processes. Other manufacturing techniques may also be used, such as chemical vapor deposition, ion stuffing, and neutron irradiation. The microlenses may have any refraction gradient, such as a radial refraction gradient, a spherical refraction gradient, or an axial refraction gradient. The microlenses may be made of a variety of different materials, such as glass, plastic, sodium chloride, etc.

Thus, implementations herein include a vehicular camera that includes one or more MLAs. The camera may be a forward-viewing camera (e.g., disposed at a windshield of the vehicle), a surround-view camera (e.g., sideward-viewing cameras disposed at the sides of the vehicle, such as at respective exterior rearview mirror assemblies, a forward-viewing camera disposed at a front portion of the vehicle, and a rearward viewing camera), a rearward-viewing camera (e.g., a rear backup camera for assisting in reversing maneuvers of the vehicle), etc. The camera may have a wide angle field of view (e.g., a fisheye camera). Each MLA includes a plurality of microlenses and one or more of the microlenses includes an outboard planar (i.e., flat or 2D) surface in contrast to a traditional curved lens or other 3D structure. The planar microlenses use gradient refractive index to focus light without a curved surface (i.e., each microlens includes a variable refractive index where the refractive index of the microlens changes across and/or through the microlens). The planar microlenses eliminate or reduce diffractive effects, multi-order scattering, and/or glare. The planar microlenses allow for radial matching of refractive power in domains such as on-axis domains, mid-field domains, and corner domains. That is, the variable refractive index of each microlens may depend upon a position of the microlens within the MLA. Put another way, microlenses in one place of the MLA, such as at the edge, may have a different gradient distribution (i.e., different variable refractive index) than microlenses at different place of the MLA, such as near a center of the MLA.

The microlenses may include one or more coatings, such as antireflective coatings, filter coatings, (e.g., filtering certain wavelengths of light, such as UV light), etc. that are more easily applied to a planar surface than a traditional curved lens. Optionally, one or more individual microlenses of the microlens array may have an antireflective coating, while one or more other individual microlenses of the microlens array may have spectral filtering. The cameras, using the MLAs, capture image data for various advanced driver assistance systems (ADAS) and/or for display on a display disposed within the vehicle. For example, the cameras may capture image data for use in an object detection system, a lane centering system, an adaptive cruise control system, a collision avoidance system, an automatic emergency braking system, etc.

The imaging sensor of the camera may capture image data for image processing and may comprise, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. The imaging array may comprise a CMOS imaging array having at least 300,000 photosensor elements or pixels, preferably at least 500,000 photosensor elements or pixels and more preferably at least one million photosensor elements or pixels or at least three million photosensor elements or pixels or at least five million photosensor elements or pixels arranged in rows and columns. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

The microlens array has a plurality of microlenses (e.g., at least four microlenses or at least 50 microlenses or at least 100 microlenses or at least 400 microlenses) arranged in rows and columns. Each individual microlens of the microlens array focuses or images light on a respective subset or sub-array of photosensors of the imaging array sensor. Thus, each microlens of the microlens array is disposed at a respective sub-array of photosensors of the imaging array sensor and images light that is incident at the camera onto the respective sub-array of photosensors of the imaging array sensor. For example, each microlens may be disposed at a photosensor sub-array that has at least 1,000 photosensors, such as at least about 5,000 photosensors. The microlens array has less rows of microlenses than the rows of photosensors of the imaging array sensor and has less columns of microlenses than the columns of photosensors of the imaging array sensor.

The camera or sensor may comprise any suitable camera or sensor, such as cameras utilizing aspects of the cameras and systems described in U.S. Publication Nos. US-2021-0296530 and/or US-2014-0168415, which are hereby incorporated herein by reference in their entireties. Optionally, the camera may comprise a "smart camera" that includes the imaging sensor array and associated circuitry and image processing circuitry and electrical connectors and the like as part of a camera module, such as by utilizing aspects of the vision systems described in U.S. Pat. Nos. 10,099,614 and/or 10,071,687, which are hereby incorporated herein by reference in their entireties.

The vehicular camera may comprise an exterior viewing camera, such as a rear backup camera or a surround vision camera (such as a rearward-viewing camera, sideward-viewing cameras disposed at the sides of the vehicle, such as at respective exterior rearview mirror assemblies, a forward-viewing camera disposed at a front portion of the vehicle), such as for systems utilizing aspects of the systems described in U.S. Pat. Nos. 10,071,687; 9,900,522; 9,834,153; 9,762,880; 9,596,387; 9,264,672; 9,126,525 and/or 9,041,806, and/or U.S. Publication No. US-2015-0022664, which are hereby incorporated herein by reference in their entireties. The rearward viewing camera may comprise a rear backup camera of the vehicle or may comprise a centrally located higher mounted camera (such as at a center high-mounted stop lamp (CHMSL) of the vehicle), whereby the rearward viewing camera may view rearward and downward toward the ground at and rearward of the vehicle. The cameras and system may utilize aspects of the systems described in U.S. Publication Nos. US-2021-0245662; US-2021-0162926; US-2021-0155167; US-2018-0134217 and/or US-2014-0285666, and/or International Publication No. WO 2022/150826, which are all hereby incorporated herein by reference in their entireties.

Optionally, the camera may comprise a forward viewing camera, such as disposed at a windshield electronics module (WEM) or the like. The forward viewing camera may utilize aspects of the systems described in U.S. Pat. Nos. 9,896,039; 9,871,971; 9,596,387; 9,487,159; 8,256,821; 7,480,149; 6,824,281 and/or 6,690,268, and/or U.S. Publication Nos. US-2020-0039447; US-2015-0327398; US-2015-0015713; US-2014-0160284; US-2014-0226012 and/or US-2009-0295181, which are all hereby incorporated herein by reference in their entireties.

Optionally, the vehicular camera may comprise an interior viewing camera, such as a cabin monitoring camera or a driver/occupant monitoring camera or occupant detection camera or the like, and may utilize aspects of the systems described in U.S. Pat. Nos. 11,518,401; 10,065,574; 10,017,114; 9,405,120 and/or 7,914,187, and/or U.S. Publication Nos. US-2022-0377219; US-2022-0254132; US-2022-0242438; US-2022-0111857; US-2021-0323473; US-2021-0291739; US-2020-0202151; US-2020-0143560; US-2020-0320320; US-2018-0231976; US-2018-0222414; US-2017-0274906; US-2017-0217367; US-2016-0209647; US-2016-0137126; US-2015-0352953; US-2015-0296135; US-2015-0294169; US-2015-0232030; US-2015-0092042; US-2015-0022664; US-2015-0015710; US-2015-0009010 and/or US-2014-0336876, and/or International Publication Nos. WO 2023/034956; WO 2022/241423 and/or WO 2022/187805, which are all hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera, the vehicular camera comprising:
an imaging array sensor, and wherein the imaging array sensor comprises at least one million photosensors arranged in rows and columns;
a microlens array;
wherein the microlens array comprises a plurality of microlenses disposed at the imaging array sensor;
wherein each individual microlens of the plurality of microlenses comprises a respective plurality of refractive indices;
wherein the microlens array is disposed at the imaging array sensor so that light incident at the vehicular camera passes through the microlens array to be incident at the imaging array sensor;
wherein light incident at and passing through each individual microlens of the microlens array is incident at a respective sub-array of the photosensors of the imaging array sensor;
wherein each individual microlens of the plurality of microlenses of the microlens array comprises a first planar surface and an opposing second planar surface separated from the first planar surface by a plate thickness dimension of the individual microlens, and wherein light incident at the vehicular camera passes through the first planar surface and through the plate thickness dimension of the respective individual microlens to exit the second planar surface of the respective individual microlens to be incident at the respective sub-array of the photosensors of the imaging array sensor associated with that respective individual microlens; and
wherein the vehicular camera is configured to be disposed at a vehicle equipped with a vehicular vision system.

2. The vehicular camera of claim 1, wherein each individual microlens of the plurality of microlenses of the microlens array comprises an antireflection coating.

3. The vehicular camera of claim 2, wherein the antireflection coating reduces multi-order scattering.

4. The vehicular camera of claim 1, wherein each individual microlens of the plurality of microlenses of the microlens array is formed using a photolithographically structured metal mask.

5. The vehicular camera of claim 4, wherein each individual microlens of the plurality of microlenses of the microlens array is formed using ion exchange.

6. The vehicular camera of claim 5, wherein the ion exchange comprises silver-sodium ion exchange.

7. The vehicular camera of claim 1, wherein at least one microlens of the plurality of microlenses of the microlens array comprises a spectral filter.

8. The vehicular camera of claim 7, wherein the spectral filter comprises an ultraviolet light filter.

9. The vehicular camera of claim 1, wherein the respective plurality of refractive indices of at least one individual microlens of the plurality of microlenses of the microlens array is different from the respective plurality of refractive indices of at least one other individual microlens of the plurality of microlenses of the microlens array.

10. The vehicular camera of claim 9, wherein the respective plurality of refractive indices of the at least one individual microlens is related to a respective position of the at least one individual microlens within the microlens array, and wherein the respective plurality of refractive indices of the at least one other individual microlens is related to a respective position of the at least one other individual microlens within the microlens array.

11. The vehicular camera of claim 1, wherein each individual microlens of the plurality of microlenses of the microlens array has a respective plurality of refractive indices that combine to provide a respective gradient refractive index.

12. A vehicular camera, the vehicular camera comprising:
an imaging array sensor, and wherein the imaging array sensor comprises at least one million photosensors arranged in rows and columns;
a microlens array;
wherein the microlens array comprises a plurality of microlenses disposed at the imaging array sensor;
wherein each individual microlens of the plurality of microlenses comprises a respective plurality of refractive indices;
wherein the respective plurality of refractive indices of at least one individual microlens of the plurality of microlenses disposed at an edge of the microlens array is different from the respective plurality of refractive indices of at least one other individual microlens of the plurality of microlenses not disposed at the edge of the microlens array;
wherein the microlens array is disposed at the imaging array sensor so that light incident at the vehicular camera passes through the microlens array to be incident at the imaging array sensor;
wherein light incident at and passing through each individual microlens of the microlens array is incident at a respective sub-array of the photosensors of the imaging array sensor;
wherein each individual microlens of the plurality of microlenses of the microlens array comprises a first planar surface and an opposing second planar surface separated from the first planar surface by a plate thickness dimension of the individual microlens, and wherein light incident at the vehicular camera passes through the first planar surface and through the plate thickness dimension of the respective individual microlens to exit the second planar surface of the respective individual microlens to be incident at the respective sub-array of the photosensors of the imaging array sensor associated with that respective individual microlens; and
wherein the vehicular camera is configured to be disposed at a vehicle equipped with a vehicular vision system.

13. The vehicular camera of claim 12, wherein each individual microlens of the plurality of microlenses of the microlens array comprises an antireflection coating.

14. The vehicular camera of claim 13, wherein the antireflection coating reduces multi-order scattering.

15. The vehicular camera of claim 12, wherein each individual microlens of the plurality of microlenses of the microlens array is formed using a photolithographically structured metal mask.

16. The vehicular camera of claim 15, wherein each individual microlens of the plurality of microlenses of the microlens array is formed using ion exchange.

17. A vehicular camera, the vehicular camera comprising:
an imaging array sensor, and wherein the imaging array sensor comprises at least one million photosensors arranged in rows and columns;
a microlens array;
wherein the microlens array comprises a plurality of microlenses disposed at the imaging array sensor;
wherein each individual microlens of the plurality of microlenses comprises a respective plurality of refractive indices that combine to provide a respective gradient refractive index;
wherein the respective plurality of refractive indices of at least one individual microlens of the plurality of microlenses is different from the respective plurality of refractive indices of at least one other individual microlens of the plurality of microlenses;
wherein the respective plurality of refractive indices of the at least one individual microlens is related to a respective position of the at least one individual microlens within the microlens array, and wherein the respective plurality of refractive indices of the at least one other individual microlens is related to a respective position of the at least one other individual microlens within the microlens array;
wherein the microlens array is disposed at the imaging array sensor so that light incident at the vehicular camera passes through the microlens array to be incident at the imaging array sensor;
wherein light incident at and passing through each individual microlens of the microlens array is incident at a respective sub-array of the photosensors of the imaging array sensor;
wherein each individual microlens of the plurality of microlenses of the microlens array comprises a first planar surface and an opposing second planar surface separated from the first planar surface by a plate thickness dimension of the individual microlens, and wherein light incident at the vehicular camera passes through the first planar surface and through the plate thickness dimension of the respective individual microlens to exit the second planar surface of the respective individual microlens to be incident at the respective sub-array of the photosensors of the imaging array sensor associated with that respective individual microlens; and
wherein the vehicular camera is configured to be disposed at a vehicle equipped with a vehicular vision system.

18. The vehicular camera of claim 17, wherein at least one individual microlens of the plurality of microlenses of the microlens array comprises an antireflection coating.

19. The vehicular camera of claim 17, wherein at least one individual microlens of the plurality of microlenses of the microlens array comprises a spectral filter.

20. The vehicular camera of claim 19, wherein the spectral filter comprises an ultraviolet light filter.

\* \* \* \* \*